(12) United States Patent
Kang et al.

(10) Patent No.: US 9,728,446 B2
(45) Date of Patent: Aug. 8, 2017

(54) METHOD OF FABRICATING SEMICONDUCTOR DEVICE

(71) Applicant: SAMSUNG ELECTRONICS CO., LTD., Suwon-si, Gyeonggi-do (KR)

(72) Inventors: Ingoo Kang, Yongin-si (KR); Dong-Min Kang, Seoul (KR); Sangkyun Kim, Yongin-si (KR); Yun-Jeong Kim, Suwon-si (KR); Jungsik Choi, Seongnam-si (KR); Young Taek Hong, Hwaseong-si (KR)

(73) Assignee: SAMSUNG ELECTRONICS CO., LTD., Suwon-Si, Gyeonggi-Do (KR)

( * ) Notice: Subject to any disclaimer, the term of this patent is extended or adjusted under 35 U.S.C. 154(b) by 82 days.

(21) Appl. No.: 14/938,941

(22) Filed: Nov. 12, 2015

(65) Prior Publication Data
US 2016/0071762 A1 Mar. 10, 2016

Related U.S. Application Data

(63) Continuation of application No. 14/466,338, filed on Aug. 22, 2014, now abandoned.

(30) Foreign Application Priority Data

Dec. 16, 2013 (KR) .......... 10-2013-0156524

(51) Int. Cl.
| | | |
|---|---|---|
| *H01L 21/768* | (2006.01) | |
| *C11D 11/00* | (2006.01) | |
| *C11D 7/06* | (2006.01) | |
| *C11D 7/50* | (2006.01) | |
| *H01L 21/3105* | (2006.01) | |
| *H01L 21/02* | (2006.01) | |

(Continued)

(52) U.S. Cl.
CPC ........ *H01L 21/76814* (2013.01); *B08B 1/002* (2013.01); *B08B 3/12* (2013.01); *B08B 7/04* (2013.01); *C11D 7/06* (2013.01); *C11D 7/3245* (2013.01); *C11D 7/5004* (2013.01); *C11D 11/0047* (2013.01); *H01L 21/02065* (2013.01); *H01L 21/0337* (2013.01); *H01L 21/31058* (2013.01); *H01L 21/31144* (2013.01); *H01L 21/32139* (2013.01); *H01L 21/76877* (2013.01); *H01L 27/11582* (2013.01)

(58) Field of Classification Search
CPC ................................ H01L 21/76841
See application file for complete search history.

(56) References Cited

U.S. PATENT DOCUMENTS

| | | |
|---|---|---|
| 5,981,394 A | 11/1999 | Ohashi et al. |
| 6,174,454 B1 | 1/2001 | Tsai et al. |

(Continued)

FOREIGN PATENT DOCUMENTS

| | | |
|---|---|---|
| JP | 2004-292792 A | 10/2004 |
| JP | 2009-245956 A | 10/2009 |

(Continued)

*Primary Examiner* — Gregory Webb
(74) *Attorney, Agent, or Firm* — Lee & Morse, P.C.

(57) ABSTRACT

Provided are a cleaning composition for removing an organic material remaining on an organic layer and a method of forming a semiconductor device using the composition. The cleaning composition includes 0.01-5 wt %. hydroxide based on a total weight of the cleaning composition and deionized water.

17 Claims, 15 Drawing Sheets

(51) Int. Cl.
*H01L 21/033* (2006.01)
*H01L 21/311* (2006.01)
*H01L 21/3213* (2006.01)
*C11D 7/32* (2006.01)
*B08B 1/00* (2006.01)
*B08B 3/12* (2006.01)
*B08B 7/04* (2006.01)
*H01L 27/11582* (2017.01)

(56) References Cited

U.S. PATENT DOCUMENTS

| | | | |
|---|---|---|---|
| 7,531,449 | B2 | 5/2009 | Park et al. |
| 7,674,401 | B2 | 3/2010 | Maruyama |
| 7,776,811 | B2 | 8/2010 | Dilley et al. |
| 2003/0116173 | A1 | 6/2003 | Humenik et al. |
| 2005/0205835 | A1 | 9/2005 | Tamboli et al. |
| 2005/0209117 | A1 | 9/2005 | Friedrich et al. |
| 2006/0175297 | A1 | 8/2006 | Yun et al. |
| 2007/0021316 | A1 | 1/2007 | Dilley et al. |
| 2007/0225186 | A1 | 9/2007 | Fisher |
| 2009/0131295 | A1* | 5/2009 | Cui ............... H01L 21/02063 510/176 |
| 2010/0056409 | A1* | 3/2010 | Walker ........... H01L 21/02063 510/176 |
| 2010/0101953 | A1 | 4/2010 | Yokoyama et al. |
| 2011/0073484 | A1 | 3/2011 | Kawagoshi et al. |
| 2011/0130000 | A1* | 6/2011 | Park ............... H01L 21/32134 438/687 |
| 2011/0136717 | A1 | 6/2011 | Tamboli et al. |
| 2011/0146725 | A1 | 6/2011 | Woo et al. |
| 2011/0152157 | A1 | 6/2011 | Woo et al. |
| 2011/0275285 | A1 | 11/2011 | Satou et al. |
| 2013/0183824 | A1* | 7/2013 | Kwon ............. H01L 21/76841 438/653 |
| 2014/0038398 | A1* | 2/2014 | Heo ............... H01L 21/02068 438/585 |
| 2014/0090663 | A1 | 4/2014 | Woo et al. |

FOREIGN PATENT DOCUMENTS

| | | |
|---|---|---|
| KR | 10-2007-0107242 A | 11/2007 |
| KR | 10-0771891 B1 | 11/2007 |
| KR | 10-2009-0046145 A | 5/2009 |

\* cited by examiner

METHOD OF FABRICATING SEMICONDUCTOR DEVICE

CROSS-REFERENCE TO RELATED APPLICATIONS

This is a continuation application based on pending application Ser. No. 14/466,338, filed Aug. 22, 2014, the entire contents of which is hereby incorporated by reference.

Korean Patent Application No. 10-2013-0156524, filed on Dec. 16, 2013, in the Korean Intellectual Property Office, and entitled: "Cleaning Composition for Removing Organic Material and Method of Forming Semiconductor Device Using the Composition," is incorporated by reference herein in its entirety.

BACKGROUND

1. Field

Example embodiments relate to a cleaning composition for removing an organic material and a method of forming a semiconductor device using the composition.

2. Description of the Related Art

As an integration density of a semiconductor device increases, there may be an increasing demand for fine patterns and multi-layered circuitry. To meet such a demand, it may be necessary to use layers, whose etch rates are different from each other. For example, a hydrocarbon-containing organic layer may have a good etch selectivity with respect to a silicon-containing layer, and it may be used as a mask layer or a sacrificial layer when the silicon-containing layer is patterned.

SUMMARY

Embodiments may be realized by providing a cleaning composition for removing an organic residue on an organic layer, the cleaning composition including 0.01 to 5 wt. % hydroxide based on a total weight of the cleaning composition; and deionized water.

The organic residue may be produced in or after a process of polishing the organic layer.

The cleaning composition may have a pH of 5 or higher.

The hydroxide may be at least one of tetramethylammonium hydroxide (TMAH), ammonium hydroxide (NH$_4$OH), lithium hydroxide (LiOH), sodium hydroxide (NaOH), potassium hydroxide (KOH), rubidium hydroxide (RbOH), or cesium hydroxide (CsOH).

The cleaning composition may further include 0.1 to 10 wt. % of an organic solvent based on a total weight of the cleaning composition.

The organic solvent may be at least one selected from the group of hydrocarbon-containing, halogenated hydrocarbon-containing, ester-containing, ether-containing, acetate-containing, glycol-containing, alcohol-containing, ketone-containing, amide-containing, aldehyde-containing, and amine-containing organic solvents.

The organic solvent may be 3-methylbutanal.

The cleaning composition may further include 0.1 to 10 wt. % of an organic acid based on a total weight of the cleaning composition.

The organic acid may be at least one selected from the group of citric acid, lactic acid, acetic acid, formic acid, oxalic acid, uric acid, fumaric acid, tartaric acid, glutamic acid, malic acid, phthalic acid, levulinic acid, stearic acid, benzoic acid, malonic acid, succinic acid, glutaric acid, adipic acid, pimelic acid, suberic acid, azelaic acid, and sebacid acid.

The cleaning composition may further include 0.1 to 10 wt. % of an amino acid based on a total weight of the cleaning composition.

The amino acid may be at least one selected from the group of alanine, arginine, asparagine, aspartic acid, cysteine, glutamic acid, glutamine, glycine, histidine, isoleucine, leucine, lysine, methionine, phenylalanine, proline, serine, threonine, tryptophan, tyrosine, and valine.

Embodiments may be realized by providing a method of fabricating a semiconductor device, the method including forming a first structure including a substrate and a first recess region formed on the substrate; forming an organic layer on the first structure to fill the first recess region; performing a polishing process to remove at least a portion of the organic layer; and performing a cleaning process using the presently disclosed cleaning composition.

The polishing process may expose a top surface of the first structure and form an organic pattern in the first recess region, and the first recess region may be a first hole exposing the substrate, and the method may further include forming a second structure on the first structure after the cleaning process, the second structure being formed to have a second hole exposing a top surface of the organic pattern; removing the organic pattern that is exposed by the second hole through the second hole; forming an active pillar to cover at least sidewalls of the first and second holes; and forming conductive lines in the first and second structures.

Each of the first and second structures may be formed to include a plurality of insulating layers and a plurality of sacrificial layers that are alternatingly stacked on the substrate, and the forming of the conductive lines in the first and second structures may include selectively removing the sacrificial layers to form gap regions; and forming the conductive lines in the gap regions.

The first structure may include an etch-target layer provided on the substrate, a plurality of first mask patterns provided parallel to each other on the etch-target layer, and a second mask layer conformally covering top and side surfaces of the first mask patterns and defining the first recess region between the first mask patterns, the polishing process may expose a top surface of the second mask layer and form an organic pattern in the first recess region, and the method may further include anisotropically etching the second mask layer to form a second mask pattern below the organic pattern.

Embodiments may be realized by providing a method for removing an organic residue from a hydrocarbon layer or organic layer, the method including providing a cleaning composition including 0.01 to 5 wt. % hydroxide based on a total weight of the cleaning composition and deionized water; and cleaning the hydrocarbon or organic layer using the cleaning composition.

The cleaning may involve use of an ultrasonic wave.

The cleaning may involve use of a brush.

The method may further include, after the cleaning, treating the hydrocarbon or organic layer with deionized water; and drying the hydrocarbon layer or organic layer using argon, nitrogen, or isopropyl alcohol.

The organic residue may be produced in or after a process of polishing the organic layer.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
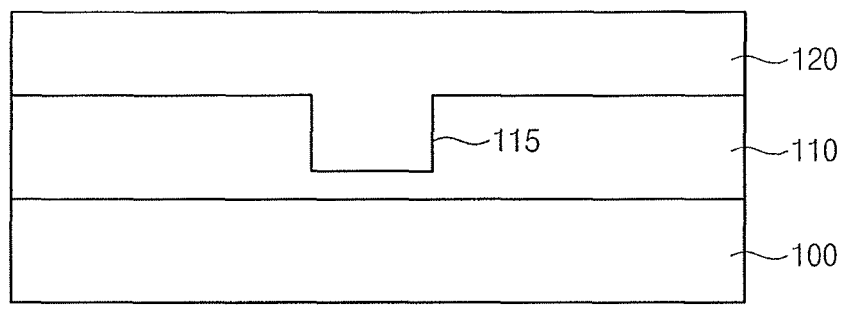
FIGS. 1, 2A, and 2B illustrate sectional views of a process of fabricating a semiconductor device, according to example embodiments.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawings, the thicknesses of layers and regions are exaggerated for clarity. Like reference numerals in the drawings denote like elements, and thus their description will be omitted.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure) is illustrated in a cross-sectional view, an electronic device may include a plurality of the device structures (e.g., memory cell structures), as would be illustrated by a plan view of the electronic device. The plurality of device structures may be arranged in an array and/or in a two-dimensional pattern.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Unless otherwise defined, all terms (including technical and scientific terms) used herein have the same meaning as commonly understood by one of skill in the art. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

As will be described below, example embodiments may be applied to fabricate a nonvolatile memory device or a three-dimensional semiconductor device.

Figure 2A:
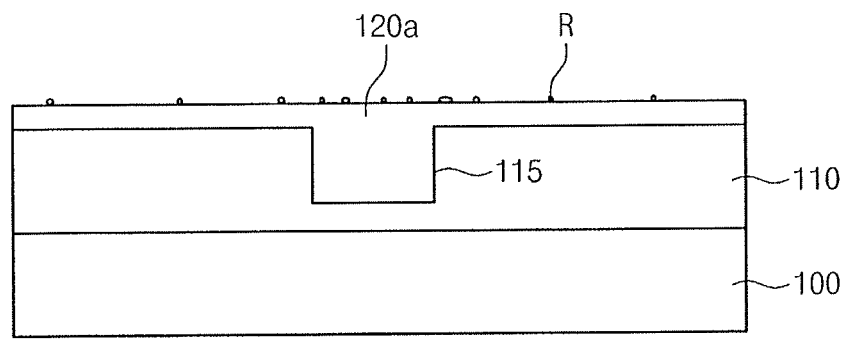
Figure 2B:
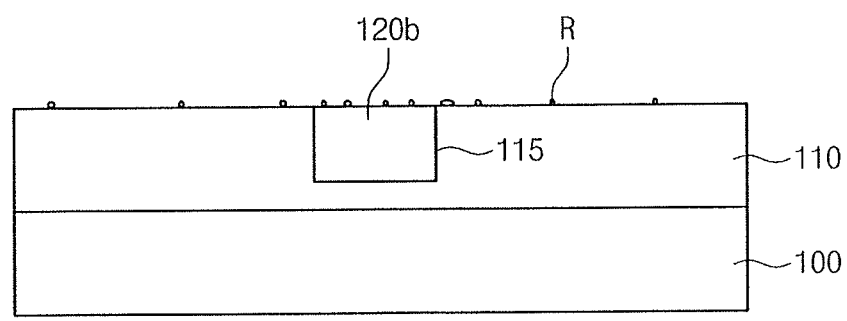

FIGS. 1, 2A, and 2B illustrate sectional views of a process of fabricating a semiconductor device, according to example embodiments.

Referring to FIG. 1, a structure 110 may be formed on a substrate 100 and may include a recessed region 115. The structure 110 may include a top portion made of oxide. An organic layer 120 may be formed on the structure 110. The organic layer 120 may be a spin-on-carbon layer or a spin-on-hardmask layer. The organic layer 120 may be a silicon-containing or silicon-free organic layer. The formation of the organic layer 120 may include a spin-coating step and a drying or baking step. The organic layer 120 may be formed to fill the recessed region 115.

Referring to FIGS. 2A and 2B, a polishing process may be performed on the organic layer 120 and may remove at least a portion of the organic layer 120 from a top surface of the structure 110. The polishing process may be performed using a chemical mechanical polishing (CMP) technology. An organic pattern 120a of a specific thickness may be formed on the structure 110, as shown in FIG. 2A, or an organic pattern 120b may be locally formed in the recessed region 115 to expose the top surface of the structure 110, as shown in FIG. 2B. In example embodiments, the polishing or CMP process may be performed using a CMP slurry composite containing 0.01-10 wt % oxide-polishing particles, 0.1-10 wt % oxidant, 0.5-10 wt % polishing regulator, 0-3 wt % surfactant, 0-3 wt % pH regulator, and 64-99.39 wt % deionized water. In certain embodiments, after the CMP process, organic residues or particles R may remain on the organic pattern 120a and/or on the organic pattern 120b and the structure 110. A cleaning process using a cleaning composition may be performed, and the organic residues or particles R may be removed.

The cleaning composition may contain hydroxide and deionized water, and the hydroxide may be present in an amount of 0.01-5 wt % based on a total weight of the cleaning composition. In example embodiments, the cleaning composition may have a pH of about 5 or higher. When the pH of the cleaning composition is higher than or equivalent to 5, zeta potentials of an organic layer, organic residues, and a silicon oxide layer may all have the same polarity, and may exert forces repulsive to one another, and the organic residues or particles R may be easily detached from surfaces of the organic pattern 120a or 120b and the structure 110. In certain embodiments, the cleaning composition may be prepared to have a pH of 10 or higher.

The hydroxide may be at least one of tetramethylammonium hydroxide (TMAH), ammonium hydroxide (NH$_4$OH), lithium hydroxide (LiOH), sodium hydroxide (NaOH), potassium hydroxide (KOH), rubidium hydroxide (RbOH), or cesium hydroxide (CsOH). In certain embodiments, the hydroxide may be added to control pH of the cleaning composition. Further, a chemical composition of the hydroxide may be adjusted to help control the pH of the cleaning composition to be 5 or higher.

The cleaning composition may further contain an organic solvent of 0.1-10 wt % based on a total weight of the cleaning composition. In example embodiments, the organic solvent may be at least one selected from the group of hydrocarbon-containing, halogenated hydrocarbon-containing, ester-containing, ether-containing, acetate-containing, glycol-containing, alcohol-containing, ketone-containing, amide-containing, aldehyde-containing, and amine-containing organic solvents. For example, the organic solvent may be 3-methylbutanal (3-MBA). The presence of the organic solvent may contribute to control of the pH of the cleaning composition and removal of organic residues or particles.

The cleaning composition may further contain an organic acid of 0.1-10 wt % based on a total weight of the cleaning composition. The organic acid may be at least one selected from the group of citric acid, lactic acid, acetic acid, formic acid, oxalic acid, uric acid, fumaric acid, tartaric acid, glutamic acid, malic acid, phthalic acid, levulinic acid, stearic acid, benzoic acid, malonic acid, succinic acid, glutaric acid, adipic acid, pimelic acid, suberic acid, azelaic acid, and sebacid acid. The organic acid may prevent the detached organic residues or particles from being re-adsorbed on the surfaces of the organic pattern 120a or on the organic pattern 120b and the structure 110 and may serve as a chelating agent.

The cleaning composition may further contain an amino acid of 0.1-10 wt % based on a total weight of the cleaning composition. The amino acid may be at least one selected from the group of alanine, arginine, asparagine, aspartic acid, cysteine, glutamic acid, glutamine, glycine, histidine, isoleucine, leucine, lysine, methionine, phenylalanine, proline, serine, threonine, tryptophan, tyrosine, and valine. The amino acid may prevent the detached organic residues or particles from being re-adsorbed on the surfaces of the organic pattern 120a or on the organic pattern 120b and the structure 110 and may serve as a chelating agent.

With other cleaning materials, it may be difficult to control a process of chemically etching the organic layer, the organic layer may be softened and exhibit a weak adhesion strength to a neighboring structure, and the organic layer may be easily damaged in a cleaning process. The cleaning composition according to example embodiments may make it possible to effectively remove organic residues or particles from the organic layer, and damage to the organic layer, such as peeling or delamination, may be minimized or prevented. The use of the cleaning composition according to example embodiments may allow for fabrication of semiconductor devices with minimal or no process failure. The cleaning composition according to example embodiments may be used in a cleaning process, which may be performed after the polishing of the organic layer.

In example embodiments, the cleaning composition may contain hydroxide and deionized water. The cleaning composition may further contain at least one additive agent, for example, an organic solvent, an organic acid, and/or an amino acid. A weight percent of the deionized water may be calculated by subtracting a sum of weight percents of the hydroxide and the additive agent from 100 wt %. For example, the cleaning composition may include hydroxide and 95-99.99 wt %. deionized water based on a total weight of the cleaning composition. As another example, the cleaning composition may include hydroxide, one additive agent, and 85-99.89 wt % deionized water based on a total weight of the cleaning composition. As another example, the cleaning composition may include hydroxide, two additive agents, and 75-99.79 wt % deionized water based on a total weight of the cleaning composition. As still another example, the cleaning composition may include hydroxide, three additive agents, and 65-99.69 wt %. deionized water based on a total weight of the cleaning composition.

The cleaning process may be performed at a temperature of 20-50° C. for 0.5-5 minutes in a dipping or rotating manner. In certain embodiments, ultrasonic wave or a brush may be used in the cleaning process. After the cleaning process, the surface of the substrate 100 may be treated with deionized water for 1-5 minutes in a dipping or rotating manner, and then, a drying process using argon, nitrogen, or isopropyl alcohol may be performed on the resulting structure.

Non-limiting experimental examples of the cleaning composition according to example embodiments will be described below.

Experimental Examples

Twenty silicon wafers were prepared. A silicon oxide layer was formed on each silicon wafer and was etched to form a recess region. Thereafter, an organic layer made of spin-on-hardmask (SOH) material was formed to fill the recess region. A CMP process was performed on the SOH layer and the SOH layer was removed from a top surface of the silicon oxide layer. The top surface of the silicon oxide layer was exposed and a SOH pattern was locally formed in the recess region.

Further, as shown in the following Table 1, twelve cleaning compositions were prepared to have compositions different from each other, while as shown in the following Table 2, eight cleaning compositions, as comparative examples, were prepared to have compositions different from each other. Cleaning processes using the prepared cleaning compositions, respectively, were performed on the wafers at room temperature for five minutes. After the cleaning processes, the wafers were treated with deionized water and were dried using nitrogen gas. Thereafter, the wafers were examined to find out whether there was (1) peeling/delamination, (2) damage (e.g., etching) to the SOH layer (3) damage (e.g., etching) to the (silicon) oxide layer, and (4) particles present on or absent from the surfaces of the wafers. The following Tables 1 and 2 summarize the experiment results.

As shown in Tables 1 and 2, peeling/delamination, damage to the SOH layer, and/or damage to the oxide layer was found on wafers that were cleaned with compositions having pH less than 5. For the electrolytic ion water, there was no peeling/delamination and no damage to the SOH layer or the oxide layer, but particles were not removed.

All of the cleaning compositions enumerated in Table 1 had pH of 5 or higher (in particular, of 10 or higher). For these cleaning compositions, there was substantially no peeling/delamination, no damage to the SOH layer or the oxide layer, and particles were well removed. These results show that the cleaning compositions according to example

TABLE 1

| No. | Additive | Composition [wt. %] | pH | Peeling/ Delamination | SOH Damage | Oxide Damage | Particle Removal |
|---|---|---|---|---|---|---|---|
| 1 | TMAH | 0.1 | 10.3 | Not Found | Not Found | Not Found | Good |
|  | DI water | 99.9 |  |  |  |  |  |
| 2 | TMAH | 0.476 | 12.6 | Somewhat | Not Found | Somewhat | Good |
|  | DI water | 99.524 |  |  |  |  |  |
| 3 | TMAH | 0.1 | ≥10 | Not Found | Not Found | Not Found | Good |
|  | DI water | 97.9 |  |  |  |  |  |
|  | Acetic Acid | 2 |  |  |  |  |  |
| 4 | TMAH | 0.2 | ≥10 | Not Found | Not Found | Not Found | Good |
|  | DI water | 97.8 |  |  |  |  |  |
|  | Formic Acid | 2 |  |  |  |  |  |
| 5 | TMAH | 0.4 | ≥10 | Not Found | Not Found | Not Found | Good |
|  | DI water | 97.6 |  |  |  |  |  |
|  | Citric Acid | 2 |  |  |  |  |  |
| 6 | TMAH | 0.1 | ≥10 | Not Found | Not Found | Not Found | Good |
|  | DI water | 97.9 |  |  |  |  |  |
|  | Oxalic Acid | 2 |  |  |  |  |  |
| 7 | TMAH | 0.2 | ≥10 | Not Found | Not Found | Not Found | Good |
|  | DI water | 97.8 |  |  |  |  |  |
|  | Glutaric Acid | 2 |  |  |  |  |  |
| 8 | TMAH | 0.4 | ≥10 | Not Found | Not Found | Not Found | Good |
|  | DI Water | 97.6 |  |  |  |  |  |
|  | Suberic Acid | 2 |  |  |  |  |  |
| 9 | TMAH | 0.1 | ≥10 | Not Found | Not Found | Not Found | Good |
|  | DI water | 97.9 |  |  |  |  |  |
|  | Arginine | 2 |  |  |  |  |  |
| 10 | TMAH | 0.2 | ≥10 | Not Found | Not Found | Not Found | Good |
|  | DI water | 97.8 |  |  |  |  |  |
|  | Aspartic acid | 2 |  |  |  |  |  |
| 11 | TMAH | 0.4 | ≥10 | Not Found | Not Found | Not Found | Good |
|  | DI water | 97.6 |  |  |  |  |  |
|  | Glutamic Acid | 2 |  |  |  |  |  |
| 12 | TMAH | 0.4 | ≥10 | Not Found | Not Found | Not Found | Very Good |
|  | DI water | 94.6 |  |  |  |  |  |
|  | Glutamine | 2 |  |  |  |  |  |
|  | 3-MBA | 3 |  |  |  |  |  |

TABLE 2

| No. | Additive | Composition [wt. %] | pH | Peeling/ Delamination | SOH Damage | Oxide Damage | Particle Removal |
|---|---|---|---|---|---|---|---|
| 13 | Hydrofluoric Acid | 0.25 | 3.11 | Found | Not Found | Found | Not Measurable |
|  | DI Water | 99.75 |  |  |  |  |  |
| 14 | Hydrofluoric Acid | 0.125 | <5 | Found | Not Found | Found | Not Measurable |
|  | DI Water | 99.875 |  |  |  |  |  |
| 15 | Sulfuric Acid | 91.7 | <5 | Found | Found | Not Found | Not Measurable |
|  | Hydrogen Peroxide | 8.3 |  |  |  |  |  |
| 16 | Sulfuric Acid | 5.7 | <5 | Found | Not Found | Not Found | Not Measurable |
|  | Hydrogen Peroxide | 1.4 |  |  |  |  |  |
|  | DI Water | 92.9 |  |  |  |  |  |
| 17 | Ammonium Hydroxide | 3.9 | <5 | Found | Not Found | Somewhat | Not Measurable |
|  | Hydrogen Peroxide | 17.7 |  |  |  |  |  |
|  | DI Water | 78.4 |  |  |  |  |  |
| 18 | Electrolytic Ion Water | 100 | <5 | Not Found | Not Found | Somewhat | No Removal |
| 19 | Citric Acid | 100 | 2.3 | Found | Not Found | Somewhat |  |
| 20 | Acetic Acid | 100 | 2.3 | Found | Not Found | Somewhat |  | embodiments are superior to those of the comparative examples in terms of peeling/delamination, damage to the SOH and oxide layers, and removal of particles.

The described cleaning compositions may be used in a process of fabricating a semiconductor device. An example of such a process will be described in more detail below.

FIGS. 3 through 10 illustrate sectional views of a process of fabricating a semiconductor device, according to other example embodiments.

Figure 3:
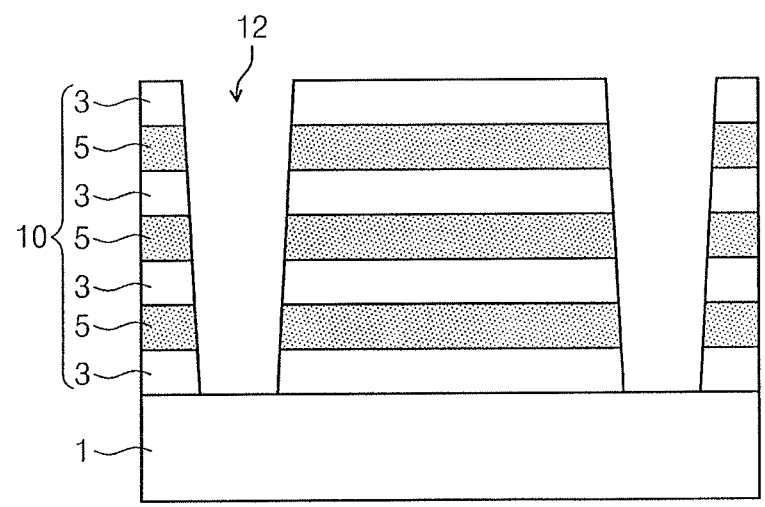
FIGS. 3 through 10 illustrate sectional views of a process of fabricating a semiconductor device, according to other example embodiments.

Referring to FIG. 3, first gate interlayered insulating layers 3 and first sacrificial layers 5 may be alternatingly stacked on a substrate 1 to form a first structure 10. The first sacrificial layers 5 may be formed of a material having an etch selectivity with respect to the first gate interlayered insulating layers 3. In example embodiments, the first gate interlayered insulating layers 3 may be a silicon oxide layer, and the first sacrificial layers 5 may be a silicon nitride layer. The first sacrificial layers 5 and the first gate interlayered insulating layers 3 may be sequentially etched to form first holes 12 exposing the substrate 1.

Figure 4:
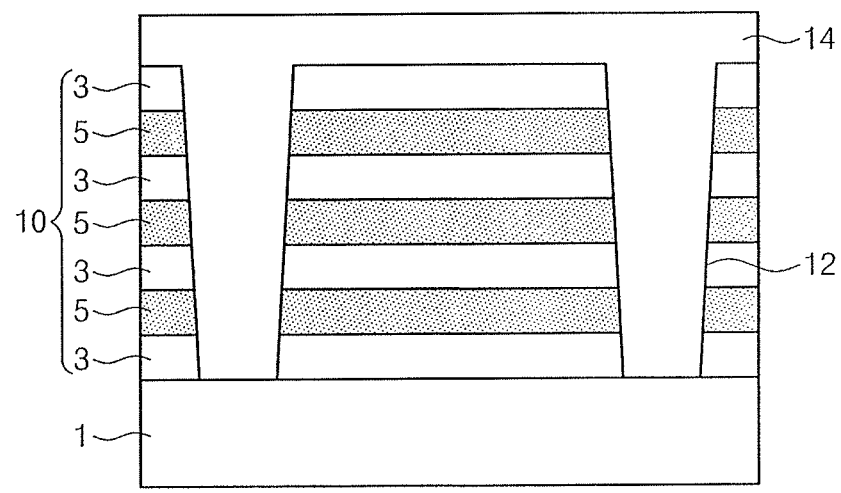

Referring to FIG. 4, an organic layer 14 may be formed on the first structure 10 to fill the first holes 12.

Figure 5:
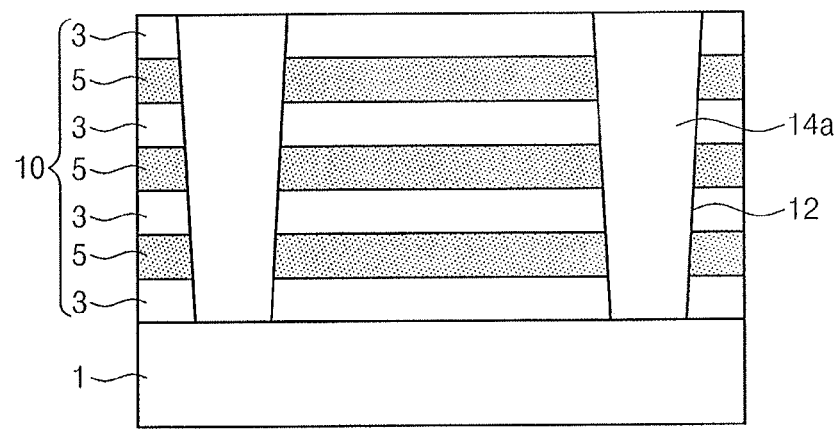

Referring to FIG. 5, a CMP process may be performed on the organic layer 14, and the organic layer 14 may be removed from a top surface of the first structure 10 and the uppermost one of the first gate interlayered insulating layers 3 may be exposed. Organic patterns 14a may remain in the first holes 12. Thereafter, a cleaning process may be performed on the resulting structure with the organic patterns 14a using at least one of the cleaning composition according to example embodiments.

Figure 6:
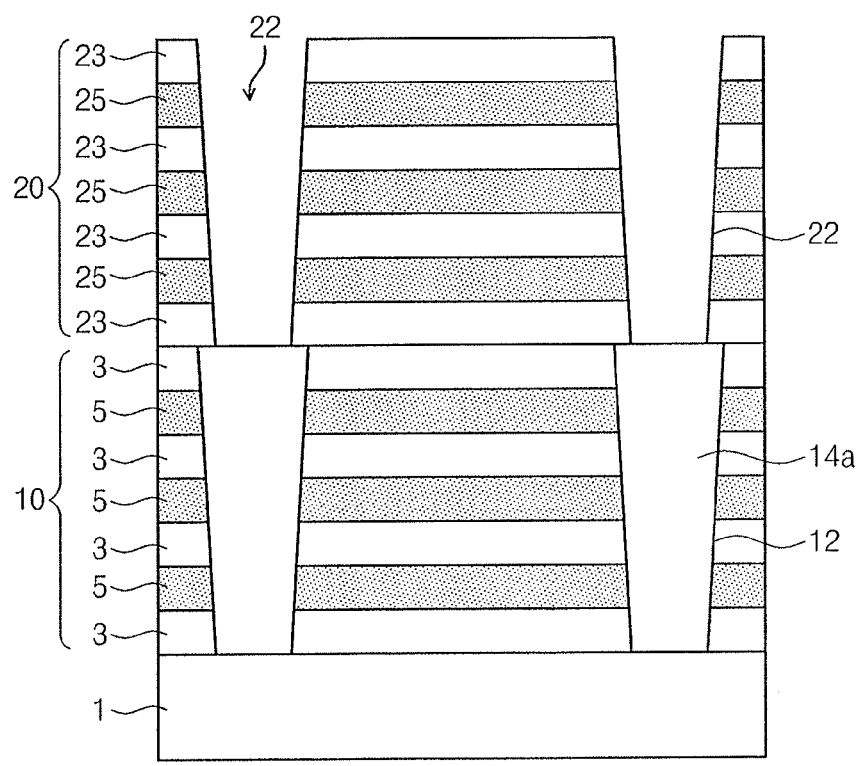

Referring to FIG. 6, second gate interlayered insulating layers 23 and second sacrificial layers 25 may be alternatingly stacked on the first structure 10 to form a second structure 20. The second sacrificial layers 25 may be formed of the same material as the first sacrificial layers 5. The second gate interlayered insulating layers 23 may be formed of the same material as the first gate interlayered insulating layers 3. The second sacrificial layers 25 and the second gate interlayered insulating layers 23 may be sequentially etched to form second holes 22 exposing the organic pattern 14a. The organic pattern 14a may make it possible to protect the first holes 12 and the substrate 1 thereunder. In certain embodiments, after the formation of the second hole 22, a cleaning process may be performed using at least one of the cleaning composition according to example embodiments.

Although two structures 10 and 20 are depicted in FIG. 6, the stacking number of the structures may be three or more.

Figure 7:
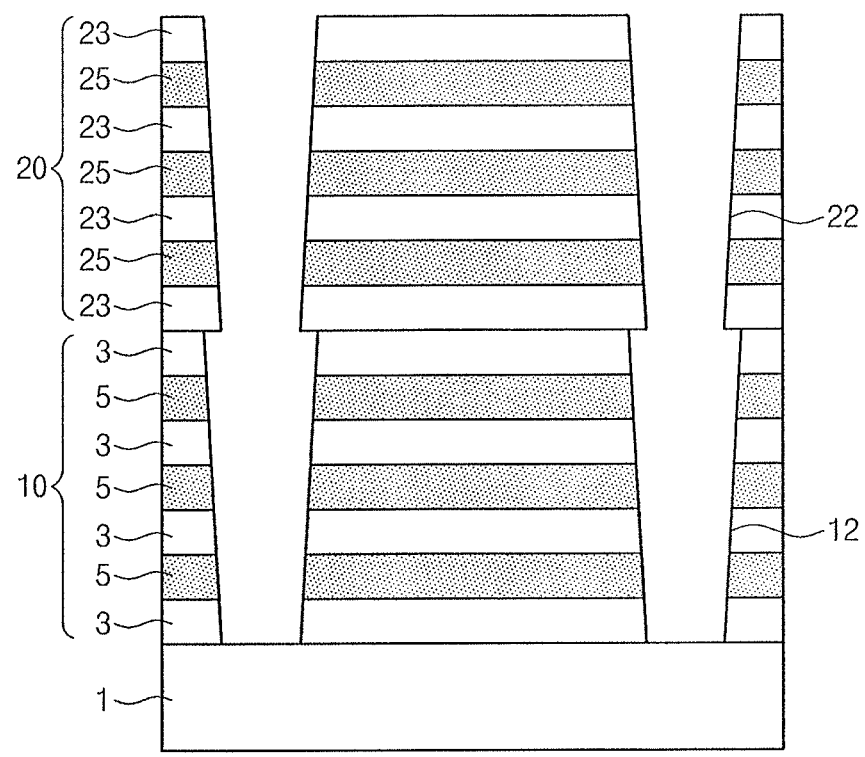

Referring to FIG. 7, an ashing process using oxygen may be performed, and the organic pattern 14a exposed by the second hole 22 may be selectively removed. The substrate 1 may be partially exposed through the first holes 12.

Figure 8:
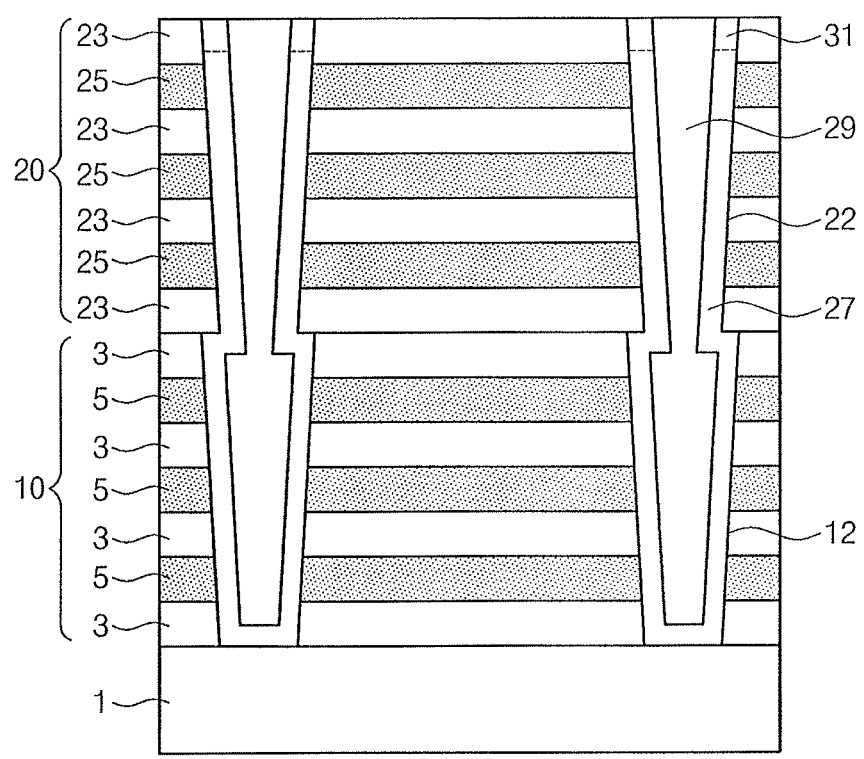

Referring to FIG. 8, a polysilicon layer may be conformally formed on the substrate 1, and a first insulating gapfill layer may be formed to fill the holes 12 and 22. Thereafter, a planarization etching process may be performed to form active pillars 27 and first insulating gapfill patterns 29. The active pillars 27 may be formed in the holes 12 and 22 to cover side and bottom surface thereof. The first insulating gapfill patterns 29 may be formed to fill the holes 12 and 22 provided with the active pillars 27. Thereafter, an ion implantation process may be performed to form drain regions 31 in upper portions of the active pillars 27.

Figure 9:
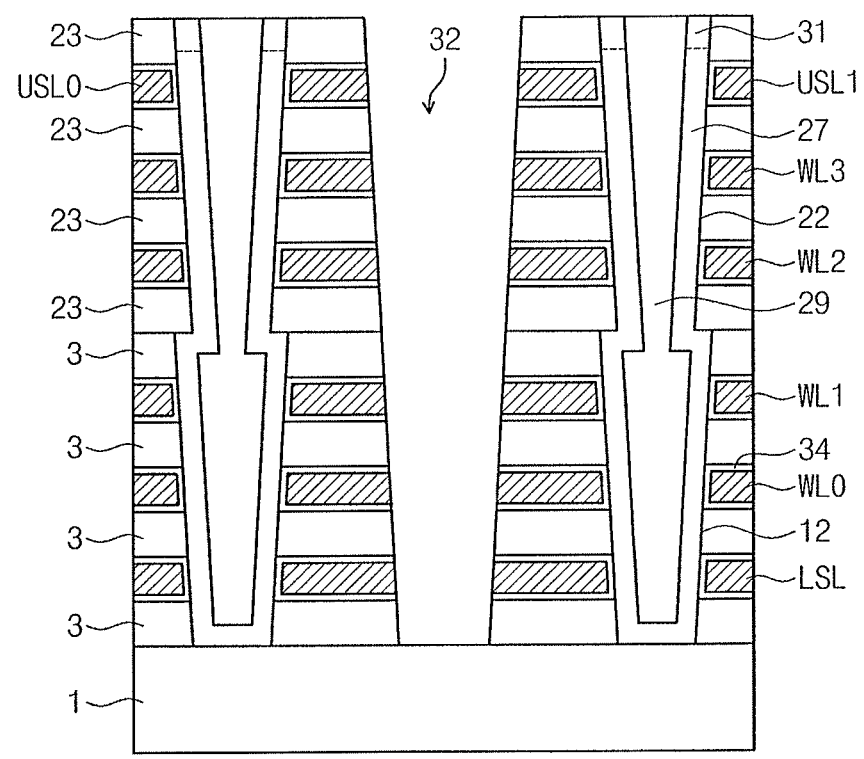

Referring to FIG. 9, the structures 20 and 10 may be patterned to form grooves 32 exposing the substrate 1. The grooves 32 may be formed spaced apart from the active pillars 27. The sacrificial layers 5 and 25 may be removed to form inter-layered empty regions. The grooves 32 may be used as paths for supplying etchant in the process of removing the sacrificial layers 5 and 25. A gate insulating layer 34 may be conformally formed in the inter-layered empty regions, and a conductive layer may be formed to fill the inter-layered empty regions and the groove 32. The gate insulating layer 34 may include a tunnel insulating layer, a charge-trap layer, and a blocking insulating layer. The conductive layer may be a doped polysilicon layer or a metal-containing layer. Next, the conductive layer may be removed from the groove 32 to expose the substrate 1. A lower selection line LSL, word lines WL0-WL3, and upper selection lines USL0 and USL1 may be formed in the inter-layered empty regions.

Figure 10:
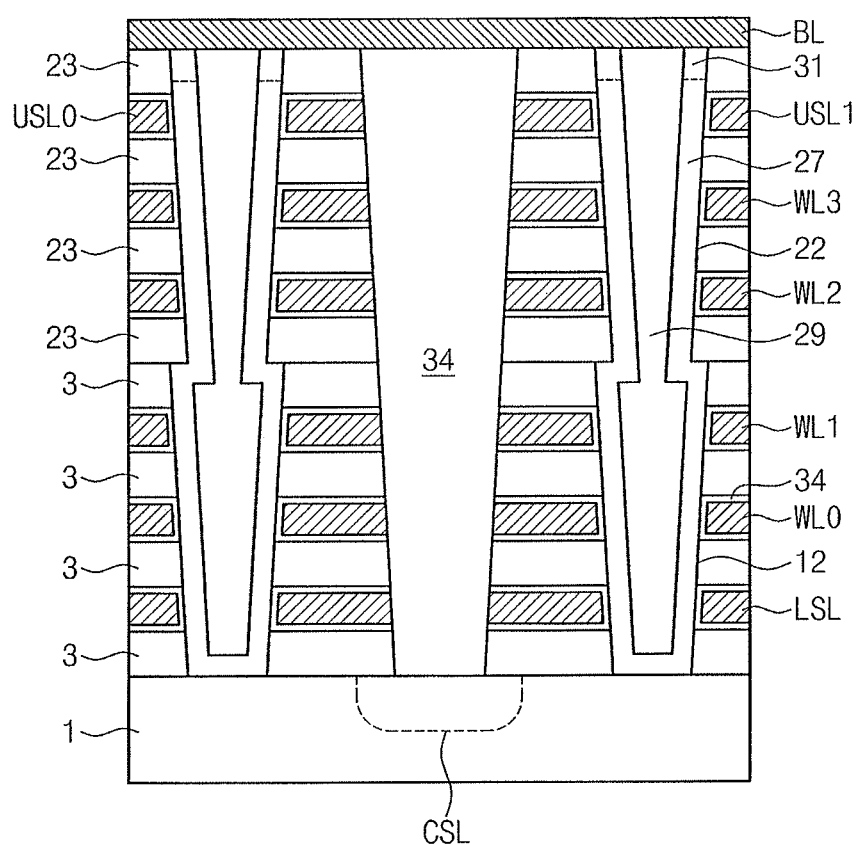

Referring to FIG. 10, an ion implantation process may be performed to form a common source line CSL below the groove 32. A second insulating gapfill layer may be formed to fill the grooves 32, and then, be planarized to form second insulating gapfill patterns 34 remaining in the grooves 32. Thereafter, a plurality of bit lines BL may be formed on the second gate interlayered insulating layer 23. The bit lines BL may be connected to the drain region 31 and be spaced apart from each other.

As described with reference to FIGS. 3 through 10, the cleaning compositions according to example embodiments may be used to fabricate 3D Vertical NAND flash memory devices.

FIGS. 11 to 17 illustrate sectional views of a process of fabricating a semiconductor device, according to other example embodiments.

Figure 11:
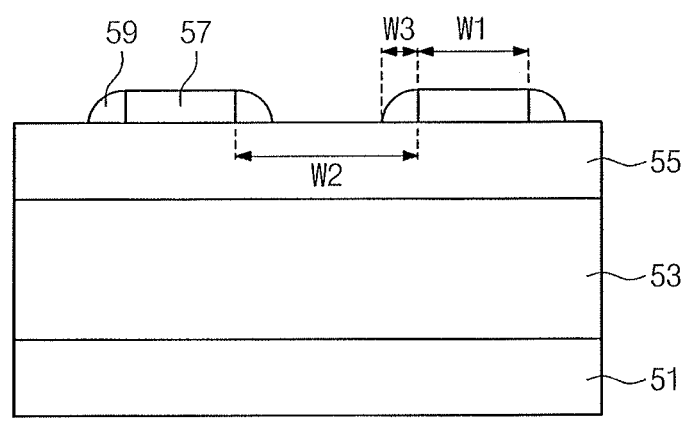
FIGS. 11 through 17 illustrate sectional views of a process of fabricating a semiconductor device, according to still other example embodiments.

Referring to FIG. 11, an etch-target layer 53 may be formed on a substrate 51. The etch-target layer 53 may be formed of or include, for example, a silicon oxide layer, a silicon nitride layer, or a polysilicon layer. A first mask layer 55 may be formed on the etch-target layer 53. The first mask layer 55 may be formed of a material (for example, an organic material) having an etch selectivity with respect to the etch-target layer 53. A second mask pattern 57 may be formed on the first mask layer 55. The second mask pattern 57 may be formed of a material having an etch selectivity with respect to the first mask layer 55. The second mask pattern 57 may be formed to have a width W1. In example embodiments, the width W1 may be substantially equal to a minimum line width that may be obtained by a photolithography process. The second mask patterns 57 may be formed to have a space W2 that is larger than the width W1 of the second mask pattern 57. For example, a ratio of the width W1 to the space W2 may be about 3:5. Spacers 59 may be formed to cover sidewalls of the second mask pattern 57. Each of the spacers 59 may be formed to have a width W3 that may be equivalent to about one-third of the width W1 of the second mask pattern 57.

Figure 12:
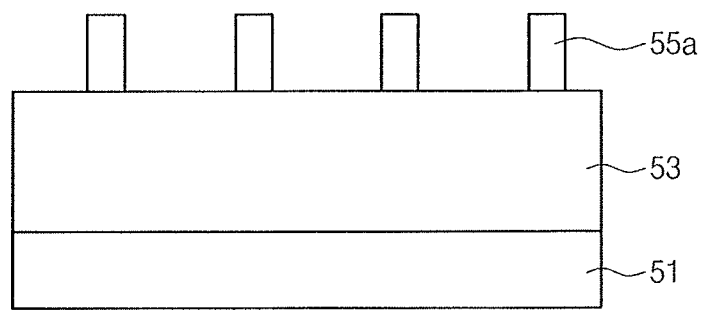

Referring to FIG. 12, the second mask pattern 57 may be removed. The first mask layer 55 may be etched using the spacers 59 as an etch mask to form first mask patterns 55a. A space between the first mask patterns 55a may be substantially equivalent to the width W1 of the second mask pattern 57.

Figure 13:
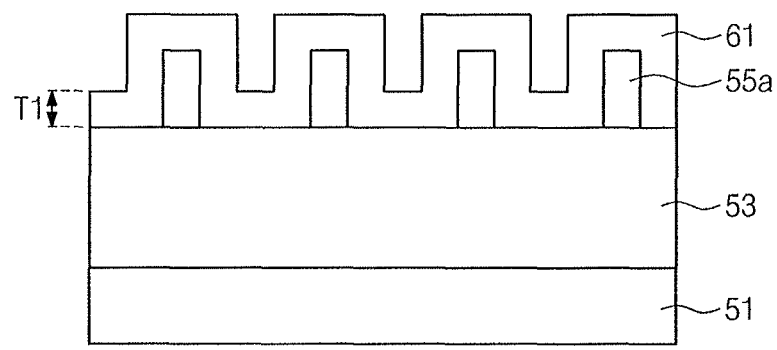

Referring to FIG. 13, a third mask layer 61 may be formed to cover conformally top and side surfaces of the first mask patterns 55. The third mask layer 61 may be, for example, a silicon oxide layer. The third mask layer 61 may be formed to have a thickness T1 that is substantially equivalent to the width W3 of the spacer 59.

Figure 14:
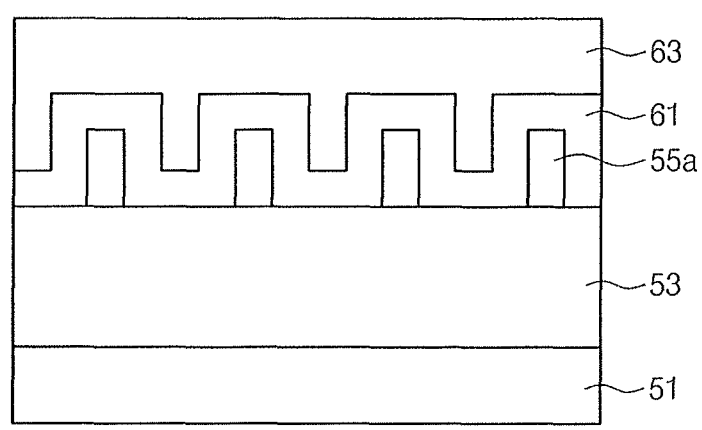

Referring to FIG. 14, an organic layer 63 may be formed on the third mask layer 61. The organic layer 63 may be formed of an organic layer. The organic layer 63 may be formed to fill gaps between the first mask patterns 55a.

Figure 15:
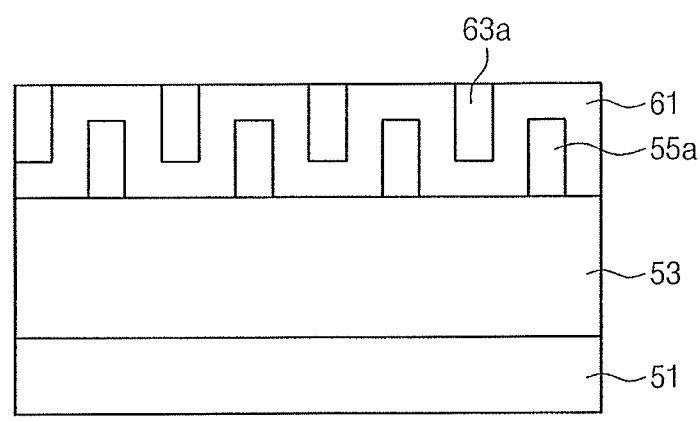

Referring to FIG. 15, a CMP process may be performed on the organic layer 63, and the organic layer 63 may be removed from the uppermost surface of the third mask layer 61 and the uppermost surface of the third mask layer 61 may be exposed. Organic patterns 63a may be formed between the first mask patterns 55a. Thereafter, a cleaning process may be performed on the resulting structure with the organic patterns 63a using at least one of the cleaning compositions according to example embodiments.

Figure 16:
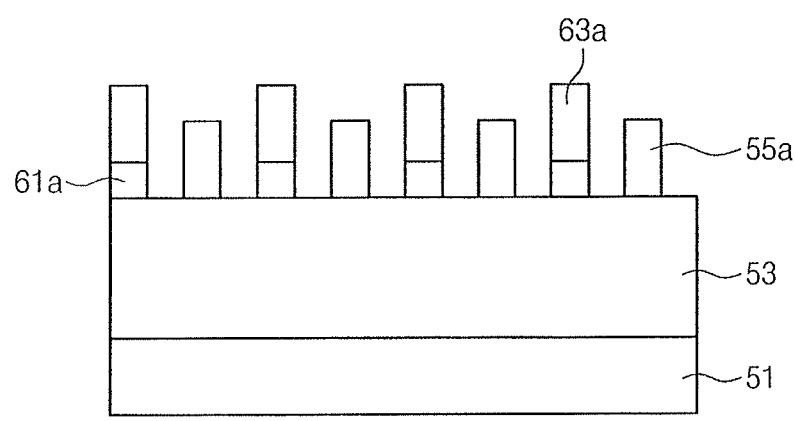

Referring to FIG. 16, an anisotropic etching process may be performed on the exposed third mask layer 61, and the third mask layer 61 may be removed between the organic patterns 63a and the first mask patterns 55a may be exposed. Third mask patterns 61a may remain below the organic patterns 63a. A space between the first mask pattern 55a and the organic pattern 63a may be substantially equal to the width W3 of the spacer 59.

Figure 17:
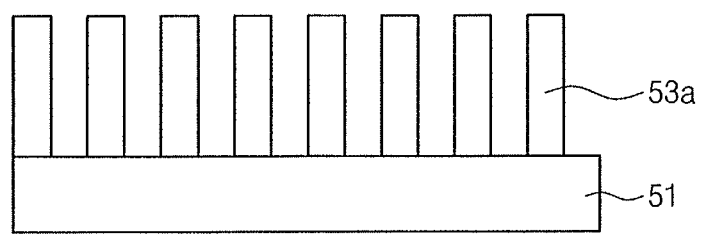

Referring to FIG. 17, the etch-target layer 53 may be etched using the first mask pattern 55a and the organic pattern 63a as an etch mask to form etch-target patterns 53a. Thereafter, the first and third mask patterns 55a and 61a and the organic pattern 63a may be removed. The etch-target patterns 53a may have a linewidth smaller than the minimum line width that may be obtained by a photolithography process.

The method described with reference to FIGS. 11 through 17 may be applied to form word lines or bit lines of DRAM (dynamic random-access memory) devices.

Figure 18:
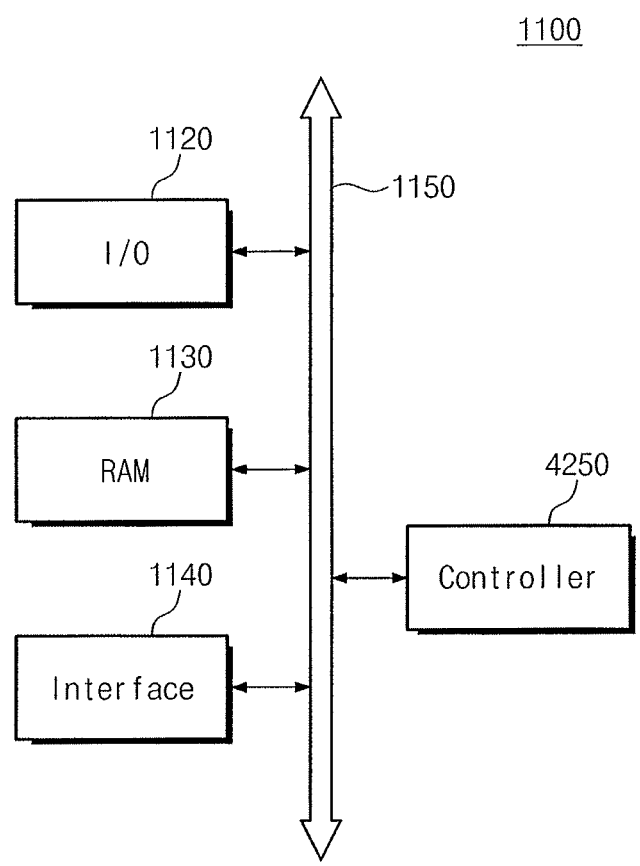
FIG. 18 illustrates a schematic block diagram of an example of memory systems including a semiconductor device fabricated by the process of example embodiments.

FIG. 18 illustrates a block diagram of an example of a memory system including a semiconductor device fabricated by a method according to example embodiments.

Referring to FIG. 18, a memory system 1100 may be applied to a PDA (personal digital assistant), a portable computer, a web tablet, a wireless phone, a mobile phone, a digital music player, a memory card and/or all the devices that may transmit and/or receive data in a wireless communication environment.

The memory system 1100 may include a controller 1110, an input/output device 1120 such as a keypad and a display device, a memory 1130, an interface 1140 and a bus 1150. The memory 1130 and the interface 1140 may communicate with each other through the bus 1150.

The controller 1110 may include at least one microprocessor, at least one digital signal processor, at least one micro controller or other process devices similar to the microprocessor, the digital signal processor and the micro controller. The memory 1130 may be used to store an instruction executed by the controller 1110. The input/output device 1120 may receive data or a signal from the outside of the system 1100 or transmit data or a signal to the outside of the system 1100. For example, the input/output device 1120 may include a keyboard, a keypad and/or a displayer.

The memory 1130 may include the nonvolatile memory device according to embodiments. The memory 1130 may further include a different kind of memory, a volatile memory device capable of random access and various kinds of memories.

The interface 1140 may transmit data to a communication network or may receive data from a communication network.

Figure 19:
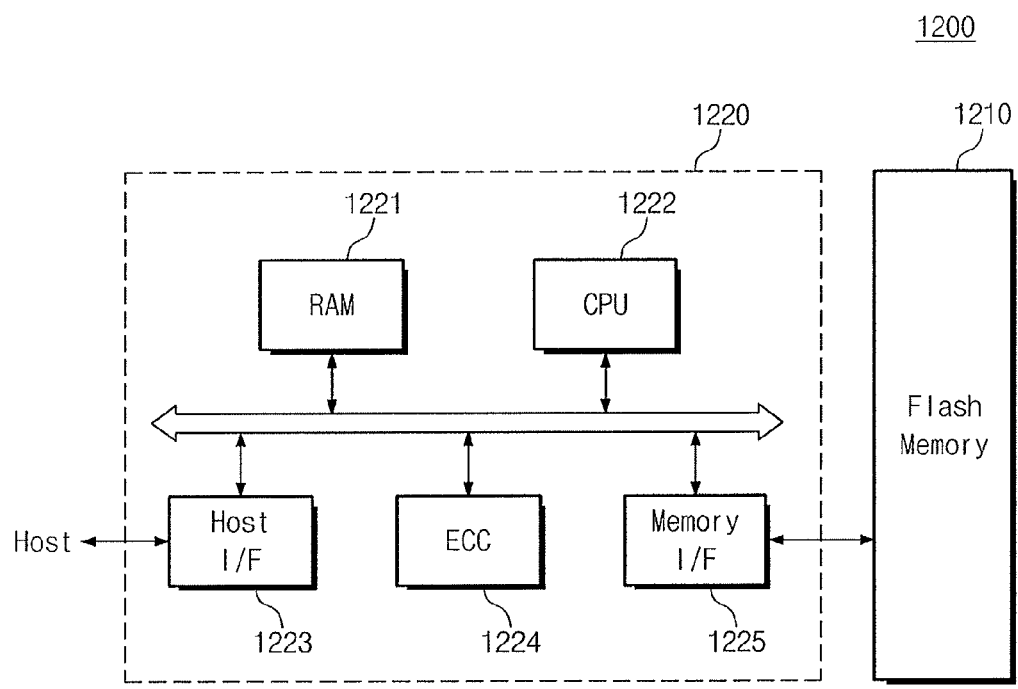
FIG. 19 illustrates a schematic block diagram of an example of memory cards including a semiconductor device fabricated by the process of example embodiments.

FIG. 19 illustrates a block diagram of an example of a memory card including a semiconductor device fabricated by a method according to example embodiments.

Referring to FIG. 19, the memory card 1200 that may support a storage capability of a large capacity may be fitted with a flash memory device 1210 according to example embodiments. The memory card 1200 according to example embodiments may include a memory controller 1220 that may control every data exchange between a host and the flash memory device 1210.

A static random access memory SRAM 1221 may be used as an operation memory of a processing unit 1222. A host interface 1223 may include data exchange protocols of a host to be connected to the memory card 1200. An error correction block 1224 may detect and correct errors included in data readout from a multi bit flash memory device 1210. A memory interface 1225 may interface with the flash memory device 1210 of example embodiments. The processing unit 1222 may perform every control operation for exchanging data of the memory controller 1220. Though not depicted in drawings, the memory card 1200 according to example embodiments may further include a ROM (read-only memory) (not shown) storing code data for interfacing with the host.

Figure 20:
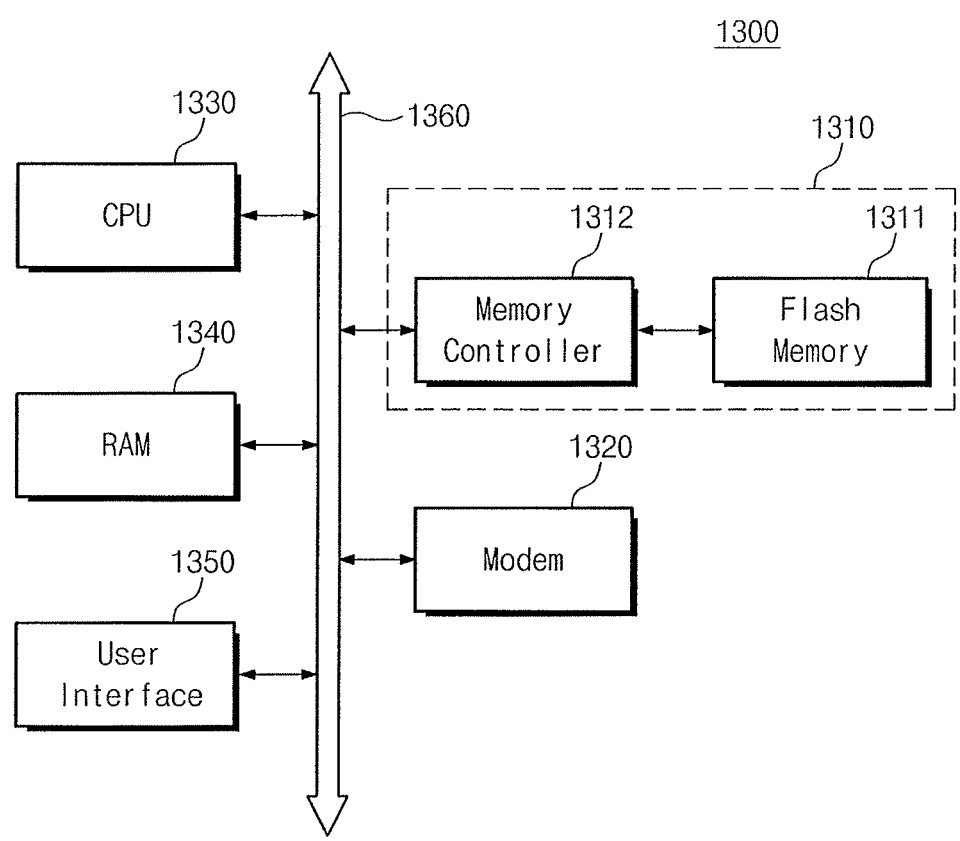
FIG. 20 illustrates a schematic block diagram of an example of information processing systems including a semiconductor device fabricated by the process of example embodiments.

FIG. 20 illustrates a block diagram of an example of an information processing system including a semiconductor device fabricated by a method according to example embodiments.

Referring to FIG. 20, a memory system 1310 may be built in a data processing system such as a mobile product or a desk top computer. The data processing system 1300 according to example embodiments may include the memory system 1310 and a modem 1320, a central processing unit 1330, a RAM (random-access memory), a user interface 1350 that are electrically connected to a system bus 1360. The memory system 1310 may be constructed so as to be identical to the memory system described above. The memory system 1310 may store data processed by the central processing unit 1330 or data inputted from an external device. The memory system 1310 may include a SSD (solid state disk) and the data processing system 1310 may stably store huge amounts of data in the memory system 1310. Reliability may be improved, the memory system 1310 may reduce resources used to correct errors, and a high speed data exchange function to the data processing system 1300 may be provided. Even though not depicted in the drawings, the data processing unit 1300 according to example embodiments may further include an application chipset, a camera image processor CIS and/or an input/output device.

Semiconductor devices or memory systems according to example embodiments may be mounted using any of various types of packages. For example, a semiconductor device or a memory system according to example embodiments may be packaged with methods such as PoP (package on package), ball grid array (BGA), chip scale package (CSP), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP, small outline (SOIC), shrink small outline package (SSOP), thin small outline (TSOP), system in package (SIP), multichip package (MCP), wafer-level fabricated package (WFP), wafer-level processed stack package (WSP) and mounted.

A cleaning process may be performed after polishing an organic layer. According to example embodiments, a cleaning composition may be provided for the cleaning process, and organic residues or particles may be removed from a surface of the organic layer. The cleaning composition may allow for effective removal of the organic residues or particles while preventing damage to the organic layer. The use of the cleaning composition may make it possible to fabricate a semiconductor device without process failure.

By way of summation and review, a fabrication process of a semiconductor device may include a step of removing an organic layer using a chemical mechanical polishing (CMP) process. A cleaning process may be performed, and organic residues remaining after the polishing process may be removed.

Example embodiments provide a cleaning composition capable of effectively removing organic residues from a surface of an organic layer. Other example embodiments provide a process of fabricating a semiconductor device using the cleaning composition.

According to example embodiments, provided is a composition for a cleaning process of removing an organic residue, which may remain after performing a CMP process on a hydrocarbon layer ($C_xH_y$) or an organic layer. Hydroxide and deionized water are contained in the cleaning composition.

The cleaning composition may be prepared to have a pH of 5 or higher. The cleaning composition may be used for a process of fabricating V-NAND (Vertical NAND) devices or a DPT (double patterning technology) process.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method of fabricating a semiconductor device, the method comprising:
   forming a first structure including an insulating layer on a substrate and a first recess region in the insulating layer;
   forming an organic layer on the first structure to fill the first recess region;
   performing a polishing process to remove at least a portion of the organic layer; and
   performing a cleaning process using the cleaning composition including:
      0.01 to 5 wt. % hydroxide based on a total weight of the cleaning composition; and
      deionized water,
   wherein the hydroxide is at least one of tetramethylammonium hydroxide (TMAH), ammonium hydroxide ($NH_4OH$), lithium hydroxide (LiOH), sodium hydroxide (NaOH), potassium hydroxide (KOH), rubidium hydroxide (RbOH), or cesium hydroxide (CsOH).

2. The method as claimed in claim 1, wherein:
   the cleaning composition further includes 0.1 to 10 wt. % of an organic solvent based on a total weight of the cleaning composition, and
   the organic solvent is at least one selected from the group of hydrocarbon-containing, halogenated hydrocarbon-containing, ester-containing, ether-containing, acetate-containing, glycol-containing, alcohol-containing, ketone-containing, amide-containing, aldehyde-containing, and amine-containing organic solvents.

3. The method as claimed in claim 1, wherein:
   the cleaning composition further includes 0.1 to 10 wt. % of an organic acid based on a total weight of the cleaning composition, and
   the organic acid is at least one selected from the group of citric acid, lactic acid, acetic acid, formic acid, oxalic acid, uric acid, fumaric acid, tartaric acid, glutamic acid, malic acid, phthalic acid, levulinic acid, stearic acid, benzoic acid, malonic acid, succinic acid, glutaric acid, adipic acid, pimelic acid, suberic acid, azelaic acid, and sebacid acid.

4. The method as claimed in claim 1, wherein:
   the cleaning composition further includes 0.1 to 10 wt. % of an amino acid based on a total weight of the cleaning composition, and
   the amino acid is at least one selected from the group of alanine, arginine, asparagine, aspartic acid, cysteine, glutamic acid, glutamine, glycine, histidine, isoleucine, leucine, lysine, methionine, phenylalanine, proline, serine, threonine, tryptophan, tyrosine, and valine.

5. The method as claimed in claim 1, wherein the cleaning composition has a pH of 5 or higher.

6. The method as claimed in claim 1, wherein performing the cleaning process comprises removing an organic residue produced in or after the polishing process.

7. The method as claimed in claim 1, wherein:
   the polishing process exposes a top surface of the first structure and forms an organic pattern in the first recess region, and the first recess region is a first hole exposing the substrate, and
   the method further comprises:
   forming a second structure on the first structure after the cleaning process, the second structure being formed to have a second hole exposing a top surface of the organic pattern;
   removing the organic pattern that is exposed by the second hole through the second hole;
   forming an active pillar to cover at least sidewalls of the first and second holes; and
   forming conductive lines in the first and second structures.

8. The method as claimed in claim 7, wherein each of the first and second structures is formed to include a plurality of insulating layers and a plurality of sacrificial layers that are alternatingly stacked on the substrate, and
   the forming of the conductive lines in the first and second structures includes:
   selectively removing the sacrificial layers to form gap regions; and
   forming the conductive lines in the gap regions.

9. The method as claimed in claim 1, wherein:
   the first structure further includes an etch-target layer provided on the substrate, and a plurality of first mask patterns provided parallel to each other on the etch-target layer,
   the insulating layer conformally covers top and side surfaces of the mask patterns and defining the first recess region between the mask patterns,
   the polishing process exposes a top surface of the insulating layer and forms an organic pattern in the first recess region, and
   the method further comprises anisotropically etching the insulating layer to form a second mask pattern below the organic pattern.

10. A method for removing an organic residue from a hydrocarbon layer or organic layer, the method comprising:
    providing a cleaning composition including:
       0.01 to 5 wt. % hydroxide based on a total weight of the cleaning composition; and
       deionized water; and polishing the hydrocarbon or organic layer, the organic residue is produced in or after the polishing process;

cleaning the hydrocarbon or organic layer to remove the organic residue using the cleaning composition, wherein the hydroxide is at least one of tetramethylammonium hydroxide (TMAH), ammonium hydroxide (NH$_4$OH), lithium hydroxide (LiOH), sodium hydroxide (NaOH), potassium hydroxide (KOH), rubidium hydroxide (RbOH), or cesium hydroxide (CsOH).

11. The method as claimed in claim 10, wherein the cleaning involves use of an ultrasonic wave.

12. The method as claimed in claim 10, wherein the cleaning involves use of a brush.

13. The method as claimed in claim 10, further comprising:

after the cleaning, treating the hydrocarbon or organic layer with deionized water; and drying the hydrocarbon layer or organic layer using argon, nitrogen, or isopropyl alcohol.

14. The method as claimed in claim 10, wherein:

the cleaning composition further includes 0.1 to 10 wt. % of an organic solvent based on a total weight of the cleaning composition, and the organic solvent is at least one selected from the group of hydrocarbon-containing, halogenated hydrocarbon-containing, ester-containing, ether-containing, acetate-containing, glycol-containing, alcohol-containing, ketone-containing, amide-containing, aldehyde-containing, and amine-containing organic solvents.

15. The method as claimed in claim 10, wherein:

the cleaning composition further includes 0.1 to 10 wt. % of an organic acid based on a total weight of the cleaning composition, and the organic acid is at least one selected from the group of citric acid, lactic acid, acetic acid, formic acid, oxalic acid, uric acid, fumaric acid, tartaric acid, glutamic acid, malic acid, phthalic acid, levulinic acid, stearic acid, benzoic acid, malonic acid, succinic acid, glutaric acid, adipic acid, pimelic acid, suberic acid, azelaic acid, and sebacid acid.

16. The method as claimed in claim 10, wherein:

the cleaning composition further includes 0.1 to 10 wt. % of an amino acid based on a total weight of the cleaning composition, and the amino acid is at least one selected from the group of alanine, arginine, asparagine, aspartic acid, cysteine, glutamic acid, glutamine, glycine, histidine, isoleucine, leucine, lysine, methionine, phenylalanine, proline, serine, threonine, tryptophan, tyrosine, and valine.

17. The method as claimed in claim 10, wherein the cleaning composition has a pH of 5 or higher.

* * * * *